United States Patent
Ueda et al.

(10) Patent No.: US 6,323,107 B1
(45) Date of Patent: Nov. 27, 2001

(54) PROCESS FOR FORMING DEVICE ISOLATION REGION

(75) Inventors: Naoki Ueda, Nara; Masayuki Hirata, Kasaoka; Shinichi Sato, Fukuyama, all of (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/547,105

(22) Filed: Apr. 11, 2000

(30) Foreign Application Priority Data

Apr. 28, 1999 (JP) .................................................. 11-121095

(51) Int. Cl.⁷ ................................................... H01L 21/76
(52) U.S. Cl. .......................... 438/435; 438/221; 438/427; 257/508
(58) Field of Search ..................................... 438/424, 221, 438/435; 257/508

(56) References Cited

U.S. PATENT DOCUMENTS

| | | | |
|---|---|---|---|
| 5,258,332 | * 11/1993 | Horioka et al. | 438/424 |
| 5,863,827 | * 1/1999 | Joyner | 438/425 |
| 5,880,004 | * 3/1999 | Ho | 438/421 |
| 6,054,343 | * 4/2000 | Ashburn | 438/221 |
| 6,074,932 | * 6/2000 | Wu | 438/435 |
| 6,103,635 | * 8/2000 | Chau et al. | 438/739 |

FOREIGN PATENT DOCUMENTS 10-12716 * 8/1996 (JP) ................................. H01L/21/76

OTHER PUBLICATIONS

M. Nandakumar et al. "Shallow Trench Isolation for advanced ULSI CMOS Technogies" Silicon Technolgy Development, Kilby Center, Texas Instruments. Sep.1998.

* cited by examiner

*Primary Examiner*—Charles Bowers
*Assistant Examiner*—David S Blum
(74) *Attorney, Agent, or Firm*—Nixon & Vanderhye P.C.

(57) ABSTRACT

A process for forming a device isolation region comprising the steps of: forming a pad oxide film and a silicon nitride film on a semiconductor substrate; removing the pad oxide film and the silicon nitride film on a region for device isolation and forming a trench in the semiconductor substrate by etching using the remaining pad oxide film and silicon nitride film as an etching mask; forming a first oxide film at least on the bottom and sidewalls of the trench and below the pad oxide film under an end portion of the silicon nitride film using the silicon nitride film as a mask resistant to oxidization; forming a gap between the silicon nitride film and the semiconductor substrate by removing the first oxide film on the bottom and the sidewalls of the trench and the first oxide film and the pad oxide film below the end portion of the silicon nitride film by etching using the silicon nitride film as an etching mask; forming a second oxide film at least on the bottom and the sidewalls of the trench and in the gap using the silicon nitride film as a mask resistant to oxidization; and forming a third oxide film so as to fill the trench, thereby to form a device isolation region.

7 Claims, 7 Drawing Sheets

PROCESS FOR FORMING DEVICE ISOLATION REGION

CROSS-REFERENCE TO RELATED APPLICATION

This application is related to Japanese application No. HEI 11(1999)-121095 filed on Apr. 28, 1999, whose priority is claimed under 35 USC §119, the disclosure of which is incorporated by reference in its entirety.

BACKGROUND OF THE INVENTION

1. Field of the Invention

The present invention relates to a process for forming a device isolation region of a trench structure.

2. Related Art

With reference to FIGS. 5(a) to 8, a conventional device isolation technique utilizing shallow trenches will be explained hereinbelow.

First, as shown in FIG. 5(a), a pad oxide film 12 of 50 to 200 Å thick and a silicon nitride film 13 of 1000 to 2000 Å thick are formed on a silicon substrate 11. Then, a resist pattern is formed to cover an active region by a lithography process. Using the resist pattern as a mask, the silicon nitride film 13 and the pad oxide film 12 in a region for forming a device isolation region are removed by dry etching. Then, a trench is formed in the silicon substrate 11 by dry etching as shown in FIG. 5(b).

Figure 6A:
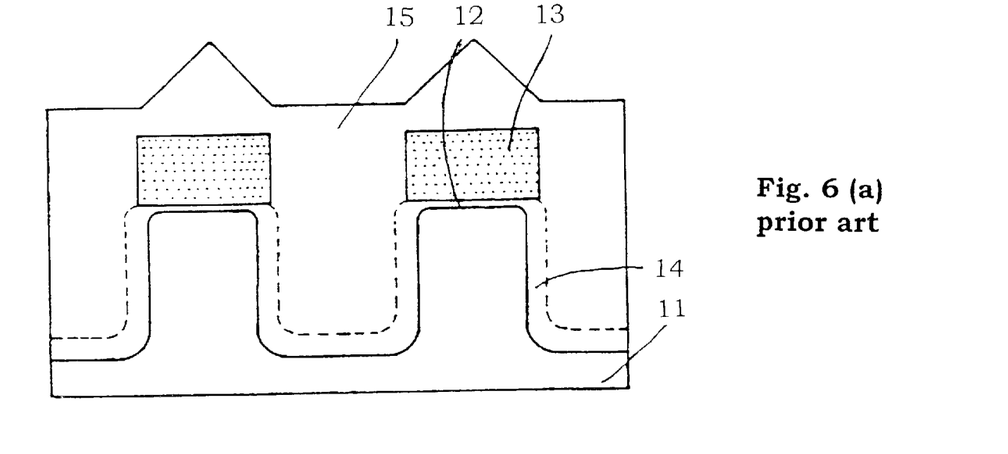
FIGS. 6(a) to 6(c) are partial sectional views illustrating the fabrication process of the semiconductor device having the conventional device isolation region of the trench structure.
Figure 6B:
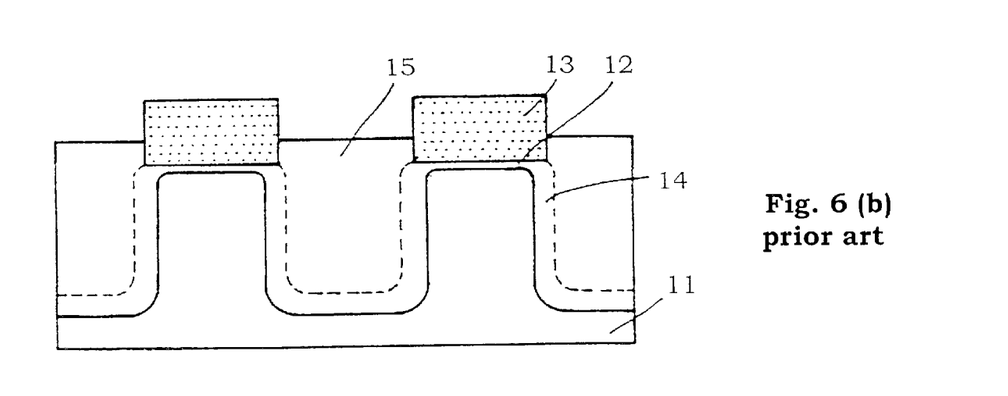
Figure 6C:
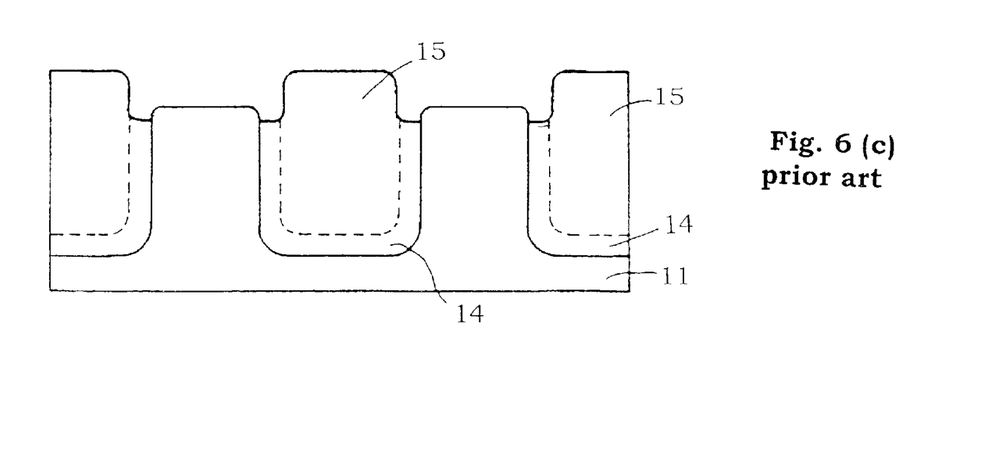
Figure 7:
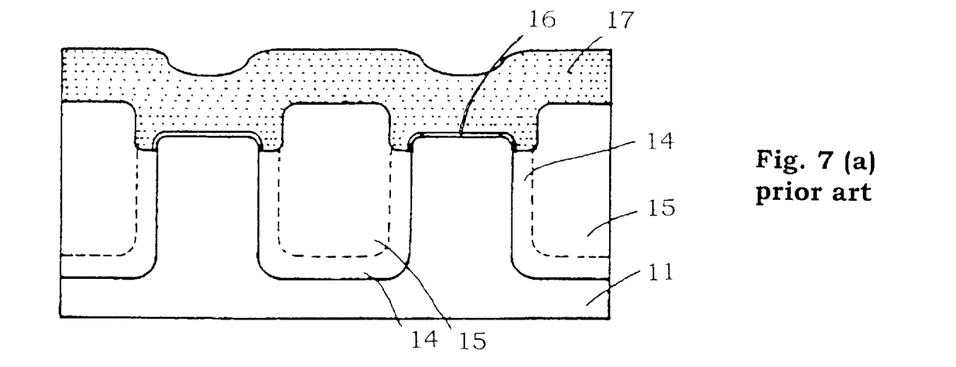
FIGS. 7(a) to 7(b) are partial sectional views illustrating the fabrication process of the semiconductor device having the conventional device isolation region of the trench structure.
Figure 8:
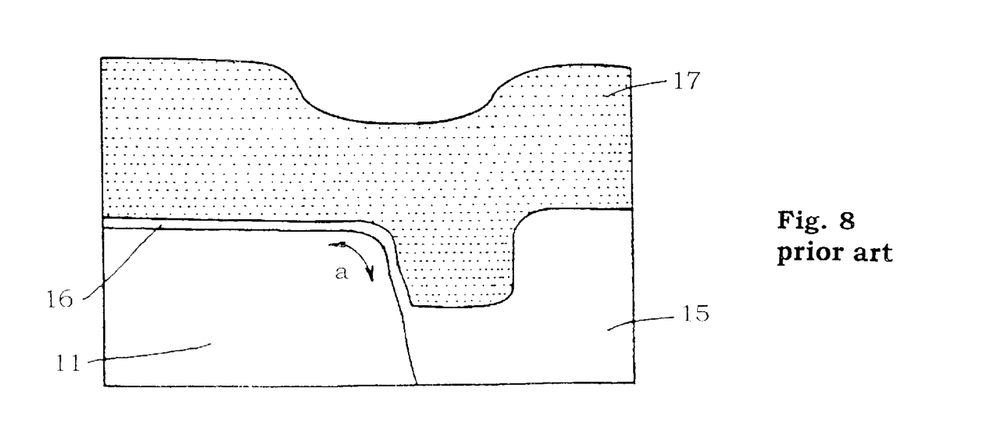
FIG. 8 is a partial enlarged view of FIG. 7(b).

Then, as shown in FIG. 5(c), the bottom and the sides of the trench formed in the silicon substrate 11 are oxidized by a thickness of 50 to 500 Å at a temperature of 900 to 1100° C. By the oxidization, an opening of the trench in the silicon substrate 11 is rounded and the sides and the bottom of the silicon substrate 11 are covered with a protective film 14 of a silicon oxide film. Then, as shown in FIG. 6(a), an oxide film 15 is deposited by CVD to completely fill the trench. Then, as shown in FIG. 6(b), the buried oxide film 15 is flattened by chemical mechanical polishing. Next, the silicon nitride film 13 and the pad oxide film 12 are removed as shown in FIG. 6(c). A gate oxide film 16 is formed, and a gate electrode material 17 is deposited thereon as seen in FIG. 7(a) and patterned into a gate electrode 17a by lithography and dry etching.

According to the above-described process, an edge of the opening of the trench formed in the silicon substrate 11 (indicated by "a" in FIG. 8) takes a sharp and almost right-angled form. The edge of the trench opening is optimized by oxidizing the edge in a certain oxidizing atmosphere at a certain oxidizing temperature after the formation of the trench so that the edge "a" is rounded. Further, the oxidization forms the protective film 14 of a silicon oxide film on the surface of the trench. After the later chemical mechanical polishing, the thickness of the flattened buried oxide film 15 filled in the trench is reduced by removal of the silicon nitride film 13 and the pad oxide film 12. As a result, a top portion of the buried oxide film in the device isolation region becomes lower than the surface of the silicon substrate in the active region as shown in FIG. 6(c).

When the gate oxide film and the gate electrode are formed thereafter, a channel region at a final stage extends to include the edge of the trench opening as shown in FIG. 7(b). Accordingly, if the edge is not sufficiently rounded, a gate electric field strengthens at this portion when a MOS transistor is operated and the transistor assumes apparent characteristics as if parasitic MOS transistors having much lower threshold value are arranged in parallel. Further, in a non-volatile memory utilizing the gate oxide film 16 as a tunnel oxide film, an F-N tunneling electric field increases in the edge region. Therefore an F-N tunneling current increases locally, and reliability in rewriting the non-volatile memory is deteriorated. Further, a thickness of the gate oxide film is reduced in the region where the edge is not sufficiently rounded, which further accelerates the above problem.

Further, in the above process, the optimization of the edge of the trench opening needs to be performed in one oxidization after the trench is formed. Therefore, to oxidize the edge for better roundness, the edge must be oxidized to a greater extent in one time. However, in case where the oxidization is performed after a certain amount of the oxide film has been formed, the silicon oxide film formed by oxidizing silicon increases in volume, which causes internal stress to accumulate in the edge region of the trench opening. Therefore, it is problematic because the device characteristics are adversely affected, the profile of the edge is varied due to a remarkable increase of the stress immediately after the oxidization or variations in the profile are increased.

SUMMARY OF THE INVENTION

The present invention is intended to improve flexibility to control the curvature of the edge region of the trench opening provided in the silicon substrate which also serves as an edge portion of an active region, alleviate the stress concentrated on the region and reduce heat hysteresis necessary to obtain a desired profile of the edge region.

According to the present invention, provided is a process for forming a device isolation region comprising the steps of: forming a pad oxide film and a silicon nitride film on a semiconductor substrate; removing the pad oxide film and the silicon nitride film on a region for device isolation and forming a trench in the semiconductor substrate by etching using the remaining pad oxide film and silicon nitride film as an etching mask; forming a first oxide film on the bottom and sidewalls of the trench and below the pad oxide film under an end portion of the silicon nitride film using the silicon nitride film as a mask resistant to oxidization; forming a gap between the silicon nitride film and the semiconductor substrate by removing the first oxide film on the bottom and the sidewalls of the trench and the first oxide film and the pad oxide film below the end portion of the silicon nitride film by etching using the silicon nitride film as an etching mask; forming a second oxide film at least on the bottom and the sidewalls of the trench and in the gap using the silicon nitride film as a mask resistant to oxidization; and forming a third oxide film so as to fill the trench, thereby to form a device isolation region.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

Hereinafter, a fabrication process of a semiconductor device according to the present invention will be explained in detail by way of example thereof with reference to FIGS. 1(a) to 3(c) illustrating the fabrication process of the semiconductor device according to the present invention.

First, as shown in FIG. 1(a), a pad oxide film 2 of 50 to 200 Å thick and a silicon nitride film 3 of 1000 to 2000 Å thick are formed on a silicon substrate 1. The pad oxide film may be formed by a known technique such as thermal oxidization. The silicon nitride film may be formed by a known technique such as CVD or sputtering. In the present invention, the silicon substrate is used as a semiconductor substrate, but the substrate is not limited thereto. Then, a resist pattern (not shown) having an opening in a region for device isolation is formed on the entire surface of the silicon substrate 1 by lithography.

Next, as shown in FIG. 1(b), a trench is formed in the silicon substrate 1, for example, by dry etching using the resist pattern as a mask. The depth of the trench is preferably 2000 to 5000 Å.

Then, as shown in FIG. 1(c), a first oxidization is performed to form a first silicon oxide film (a first oxide film) 4a on the sides and the bottom of the trench formed in the silicon substrate 1. In the first oxidization, the obtained silicon oxide film gives greater stress to the circumference thereof than in a second oxidization to be performed later. This is because the silicon substrate 1 and the pad oxide film 2 under the silicon nitride film 3 in an edge region of the trench scarcely have a space therebetween at the first oxidization. The greater the thickness of the oxide film is and the higher the oxidization temperature is, the larger the stress due to an expansion in volume of the oxide film during the oxidization becomes. The reason for the latter is that the higher the oxidization temperature is, the greater the oxidization rate becomes, thereby the oxide film is expanded in volume in a short period.

The first oxidization is desirable to be performed at a low temperature such as 950° C. or low (ex., 400 to 950° C.) so that the stress is suppressed lower. The thickness of the resulting first silicon oxide film is desirably thin such as 350 Å (ex., 20 to 500 Å) so that the stress is suppressed lower. It is needless to say that a portion defined by a top surface of the semiconductor substrate and a side of the trench (hereinafter refereed to as "a corner portion") is rounded by the first oxidization, but the corner portion is not necessarily rounded to a sufficient extent at this point of time.

Then, as shown in FIG. 1(d), the first silicon oxide film 4a in the trench is removed, for example, by etching with a hydrofluoric acid solution using the silicon nitride film 3 as an etching mask. By the etching, an opening (indicated by "b" in FIG. 4) is formed between the silicon substrate and the end portion of the silicon nitride film in the corner portion. Providing the opening is effective in preliminarily eliminating the oxide film which will cause stress in the later second oxidization step. It is also effective in removing defects and contaminants at the sides and the bottom of the trench caused by the etching for forming the trench.

The above-described etching needs to be performed to such an extent that the silicon substrate at the bottom and the sides of the trench is exposed and the oxide film on the corner portion (the rounded portion in particular) is completely removed. As a result thereof, an end portion of the pad oxide film moves inward from an end portion of the silicon nitride film lying thereon. The thickness of the pad oxide film is the same at the end portion and in the neighborhood of the center of the active region. The etching is desirably conducted to reduce 25% or more (ex., 120 to 200% or more) of the thickness of the oxide film formed by the first oxidization.

Figure 1:
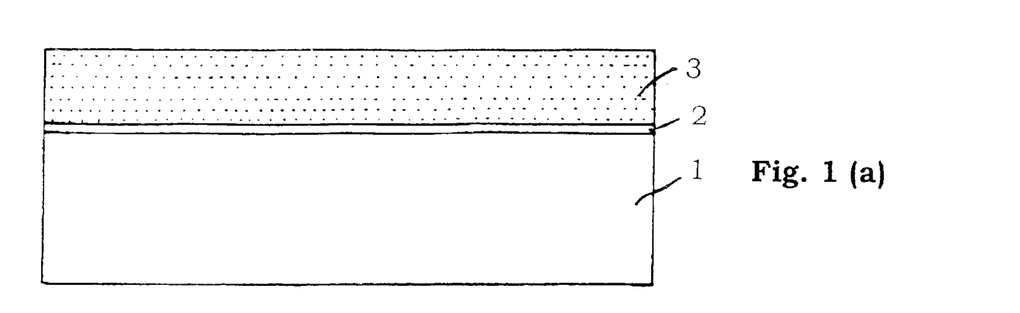
FIGS. 1(a) to 1(d) are partial sectional views illustrating a fabrication process of a semiconductor device according to the present invention.
Figure 2:
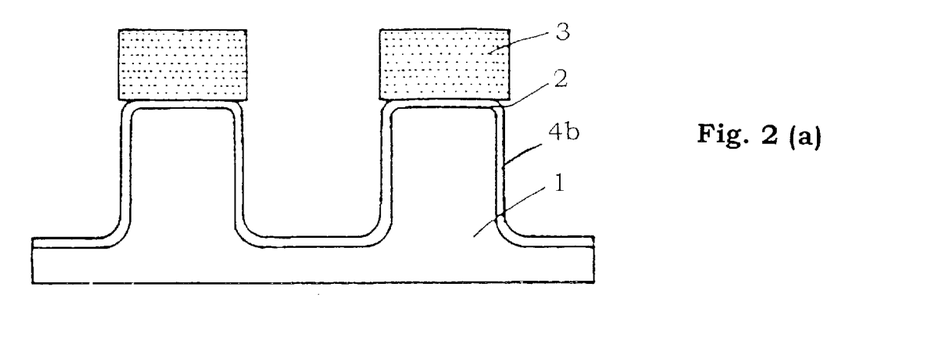
FIGS. 2(a) to 2(c) are partial sectional views illustrating the fabrication process of the semiconductor device according to the present invention.
Figure 3:
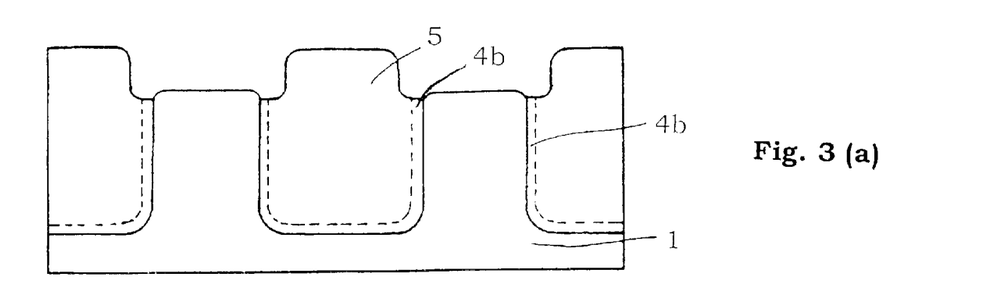
FIGS. 3(a) to 3(c) are partial sectional views illustrating the fabrication process of the semiconductor device according to the present invention.
Figure 4:
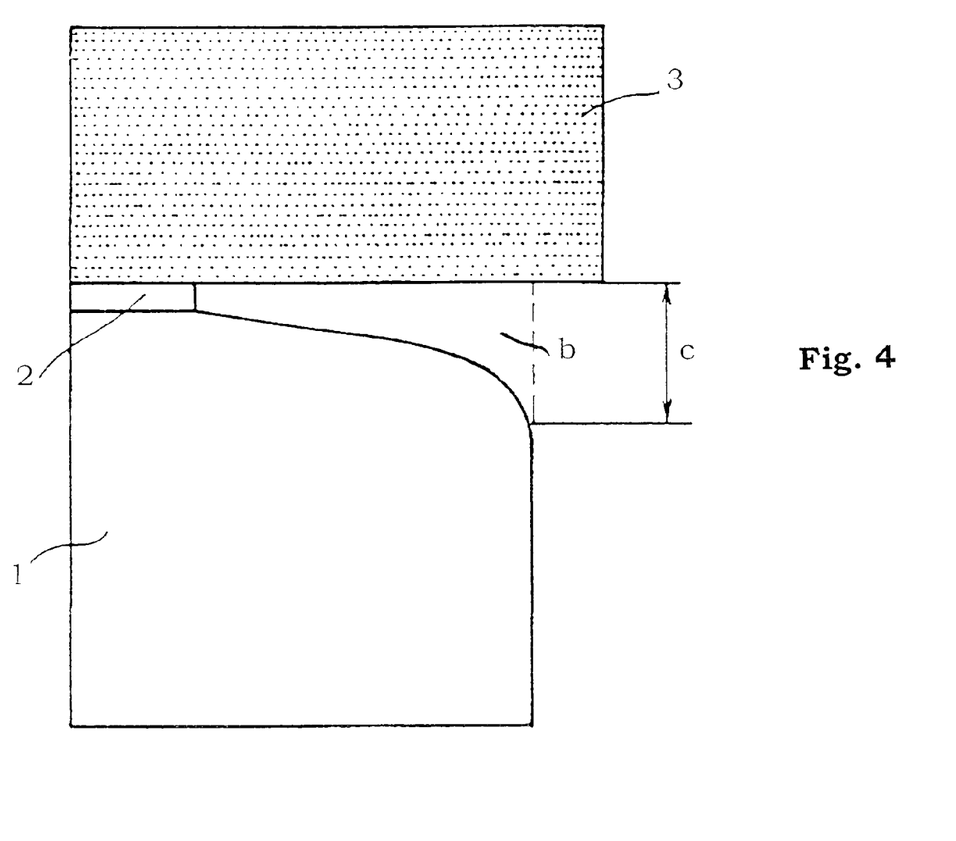
FIG. 4 is a partially enlarged view of FIG. 1(d)
Figure 5:
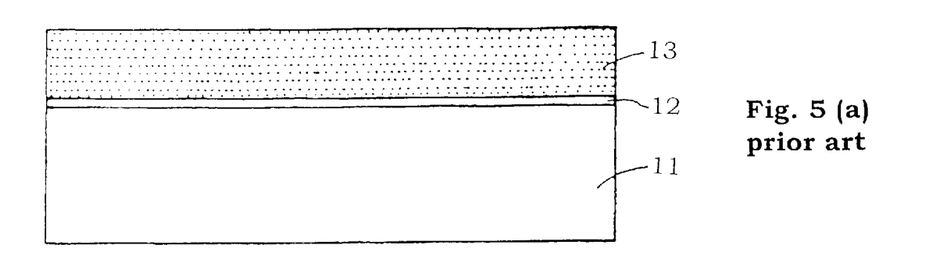
FIGS. 5(a) to 5(c) are partial sectional views illustrating a fabrication process of a semiconductor device having a conventional device isolation region of a trench structure.

Accordingly, size "c" of the opening "b" becomes larger than the thickness of the pad oxide film. The larger the size "c" is, the more the stress can be prevented from accumulating in the second oxidization performed later. For example, the size "c" is preferably larger than the thickness of the pad oxide film by 110 to 200% of the latter. However, the size "c" is determined according to the thickness of the first oxide film 4a and the oxidization conditions for the first oxide film 4a.

Next, as shown in FIG. 2(a), the corner portion is rounded by the second oxidization using the silicon nitride film as a mask resistant to oxidization and at least the sides and the bottom of the trench are covered with a second silicon oxide film (a second oxide film) 4b. Since the space has been provided between the silicon substrate 1 and the silicon nitride film 3 at the corner portion in the previous step, the space permits the volume expansion of the silicon oxide film grown at the corner portion, which is different from the first oxidization. Therefore, in the second oxidization, the stress due to the volume expansion of the oxide film between the silicon substrate and the silicon nitride film at the corner portion is reduced as compared with the first oxidization. Further, since the opening has been previously provided, an oxidization seed is easily supplied to the corner portion so that the corner portion can be effectively rounded.

In the second oxidization according to the present invention, even if it is performed at a high temperature and/or to form a thicker oxide film, which generally causes greater stress than the conventional oxidization, the stress accumulated on the corner portion is restrained to an extent similar to that in the conventional oxidization. Where the oxidization similar to the conventional one is applied to the present invention, the stress is more reduced.

The stress accumulated on the corner portion by the first oxidization is alleviated by removing the first silicon oxide film. Therefore, even if the second oxidization is performed to the same extent as the conventional one, the stress accumulation by the second oxidization is also inhibited. Accordingly, as described above, the oxidization temperature in the first oxidization is preferably 950° C. or low and the thickness of the resulting first silicon oxide film is preferably 350 Å or less. The second oxidization is preferably performed at a temperature similar to or higher than that for the first oxidization within a range of 900 to 1100° C. The thickness of the second silicon oxide film is preferably similar to or larger than that of the first silicon oxide film within a range of 50 to 500 Å. In particular, the second oxidization is intended to round the corner portion. Therefore, the second oxidization is preferably performed at about 1100° C. at which viscosity of silicon at a high temperature can be utilized.

It is also possible to give priority to improvement in quality by suppressing the stress given to the corner portion over the rounding of the corner portion. In this case, the second oxidization is preferably performed at 950° C. or low. More specifically, where the first oxidization is performed at 920° C. to form the first silicon oxide film of 250 Å thick, the second oxidization may be performed at 1100° C. to form the second silicon oxide film of 350 Å thick. Further, where the first oxidization is performed at 920° C. to form the first silicon oxide film of 250 Å thick, the second oxidization may be performed at 920° C. to form the second silicon oxide film of 350 Å thick.

Thereafter, as shown in FIG. 2(b), a silicon oxide film (a third oxide film) 5 is deposited, for example, by CVD to fill the trench so that a device isolation region is formed.

Further, as shown in FIG. 2(c), the silicon oxide film 5 is flattened by subjecting it to chemical mechanical polishing. Next, as shown in FIG. 3(a), the pad oxide film 2 and the silicon nitride film 3 are removed to complete the formation of the active region and the device isolation region. Then, as shown in FIGS. 3(b) and 3(c), a gate oxide film 6 and an electrode material 7 of polysilicon or the like are deposited and patterned by a known technique to form a gate electrode 7a.

As detailed in the above, according to the present invention, a corner portion of a desired round shape can be obtained while suppressing both stress accumulated on the corner portion and heat hysteresis smaller. In other words, the suppression of the stress and the heat hysteresis allows preventing generation of defects of silicon, stabilizing the shape of the corner portion, thereby to realize high reliability of semiconductor devices and non-volatile memories as well as high accuracy of threshold value distribution. Further, where the stress and the heat hysteresis have the same level as the conventional ones, the round corner portion having greater curvature can be obtained. Moreover, an oxide film containing contaminants and defects is entirely removed from a trench formed in a substrate, a silicon substrate with high quality can be prepared.

What is claimed is:

1. A process for forming a device isolation region comprising the steps of:

forming a pad oxide film and a silicon nitride film on a semiconductor substrate;

removing the pad oxide film and the silicon nitride film on a region for device isolation and forming a trench in the semiconductor substrate;

forming a first oxide film at least on the bottom and sidewalls of the trench and below the pad oxide film under an end portion of the silicon nitride film and without completely filling the trench using the silicon nitride film as a mask resistant to oxidation so that a top edge comer of the trench is rounded to a first extent as a result of forming the first oxide film;

forming a gap between the silicon nitride film and the semiconductor substrate by removing the first oxide film on at least the bottom and the sidewalls of the trench, and removing the first oxide film and the pad oxide film below the end portion of the silicon nitride film by etching using the silicon nitride film as an etching mask;

forming a second oxide film at least on the bottom and the sidewalls of the trench and in the gap using the silicon nitride film as a mask resistant to oxidation in a manner so as to round the top edge comer of the trench to a second extent greater than said first extent; and after the second rounding of the top edge comer of the trench to the second extent, forming a third oxide film so as to fill the trench, thereby to form a device isolation region.

2. A process according to claim 1, wherein the second oxide film is thicker than the first oxide film.

3. A process according to claim 2, wherein the first oxide film has a thickness of 20 to 500 Å and the second oxide film has a thickness of 50 to 500 Å.

4. A process according to claim 1, wherein the second oxide film is formed at a temperature higher than a temperature for forming the first oxide film.

5. A process according to claim 4, wherein the first oxide film is formed at 400 to 950° C. and the second oxide film is formed at 900 to 1100° C.

6. A process according to claim 1, wherein the first oxide film between the silicon nitride film and the semiconductor substrate is removed toward a width direction of the semiconductor substrate from the end portion of the silicon nitride film by 120 to 200% or more of the thickness of the first oxide film on the sidewalls of the trench.

7. A process according to claim 1, wherein the gap between the end portion of the silicon nitride film and the semiconductor substrate is formed larger than the pad oxide film by 110 to 200% of the latter in a depth direction of the semiconductor substrate.

* * * * *